(12) United States Patent
Harada

(10) Patent No.: US 12,314,096 B2
(45) Date of Patent: May 27, 2025

(54) ELECTRONIC DEVICE

(71) Applicant: TOSHIBA TEC KABUSHIKI KAISHA, Tokyo (JP)

(72) Inventor: Shintaro Harada, Izunokuni (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 165 days.

(21) Appl. No.: 18/317,119

(22) Filed: May 15, 2023

(65) Prior Publication Data

US 2024/0103590 A1 Mar. 28, 2024

(30) Foreign Application Priority Data

Sep. 22, 2022 (JP) ................................. 2022-151471

(51) Int. Cl.
*G06F 1/20* (2006.01)
*H05K 7/20* (2006.01)

(52) U.S. Cl.
CPC ........... *G06F 1/20* (2013.01); *H05K 7/20136* (2013.01)

(58) Field of Classification Search
CPC ..... G06F 1/20; H05K 7/20136; H05K 5/0214
See application file for complete search history.

(56) References Cited

U.S. PATENT DOCUMENTS

| | | | | |
|---|---|---|---|---|
| 5,694,294 A | * | 12/1997 | Ohashi | G06F 1/203 361/679.48 |
| 6,443,644 B1 | * | 9/2002 | Takeda | G06F 3/0202 400/490 |
| 7,619,880 B2 | * | 11/2009 | Liang | G06F 1/1616 361/679.08 |
| 11,711,904 B2 | * | 7/2023 | Rehak | H05K 7/20154 361/692 |
| 2011/0214897 A1 | * | 9/2011 | Yoshida | H05K 7/20918 174/50.51 |
| 2013/0050942 A1 | * | 2/2013 | Konishi | H05K 7/20127 361/692 |
| 2014/0352930 A1 | * | 12/2014 | Hanks | F28D 1/0477 165/173 |

(Continued)

FOREIGN PATENT DOCUMENTS

| | | | |
|---|---|---|---|
| JP | 2007188599 A | * | 7/2007 |
| JP | 2021-156509 | | 10/2021 |

OTHER PUBLICATIONS

Mori Yukio, "Electronic Device", Jul. 26, 2007, Toshiba Corp, Entire Document (Translation of JP 2007188599). (Year: 2007).*

*Primary Examiner* — Stephen S Sul

(74) *Attorney, Agent, or Firm* — Amin, Turocy & Watson, LLP

(57) ABSTRACT

Provided are a structure capable of protecting an air intake portion from entry of water droplets or the like, and an electronic device including the structure. The electronic device includes: a housing which is a box-shaped container having an open upper surface, configured to house an electronic component and a fan for blowing air downward, and provided with an air exhaust hole; an inner lid to be attachable and detachable at a position at which an opening of the housing is closed, and provided with an air intake hole upstream of the fan in an air-blowing direction; and an upper lid provided to overlap the inner lid, and facing, from above, a surface provided with the air intake hole with a gap therebetween.

17 Claims, 4 Drawing Sheets

(56) References Cited

U.S. PATENT DOCUMENTS

| | | | |
|---|---|---|---|
| 2015/0017905 A1* | 1/2015 | Li | G06F 1/203 454/184 |
| 2015/0062805 A1* | 3/2015 | Katsumata | F28F 13/06 361/679.49 |
| 2016/0124473 A1* | 5/2016 | Lin | H05K 7/20136 361/679.49 |
| 2017/0127573 A1* | 5/2017 | Hirai | H05K 7/20809 |

\* cited by examiner

ELECTRONIC DEVICE

CROSS-REFERENCE TO RELATED APPLICATION

This application is based upon and claims the benefit of priority from Japanese Patent Application No. 2022-151471, filed on Sep. 22, 2022, the entire contents of which are incorporated herein by reference.

FIELD

Embodiments described herein relate to an electronic device.

BACKGROUND

In the related art, an electronic device such as a personal computer (PC) is often provided with a structure that secures ventilation inside a housing because a component such as a central processing unit (CPU) that requires heat dissipation is incorporated therein, or the like. A hole for ventilation (a ventilation hole serving as an air intake hole or an air exhaust hole) is provided in the housing.

The electronic device such as PC may be placed in an environment where water droplets or oil droplets scatter, such as a cooking place in a store. In such a case, the water droplets or the like may enter the housing through the ventilation hole. Therefore, the housing is required to have a structure that does not allow the water droplets or the like to enter.

As a structure for providing a constant flow of air in the housing, for example, a server rack disclosed in the related art is provided. If the structure is a relatively large object as in this example, it is considered relatively easy to add an existing configuration for preventing the water droplets or the like from entering through the ventilation hole. However, adding an existing configuration is difficult for an electronic device requiring size reduction.

DETAILED DESCRIPTION

Figure 1:
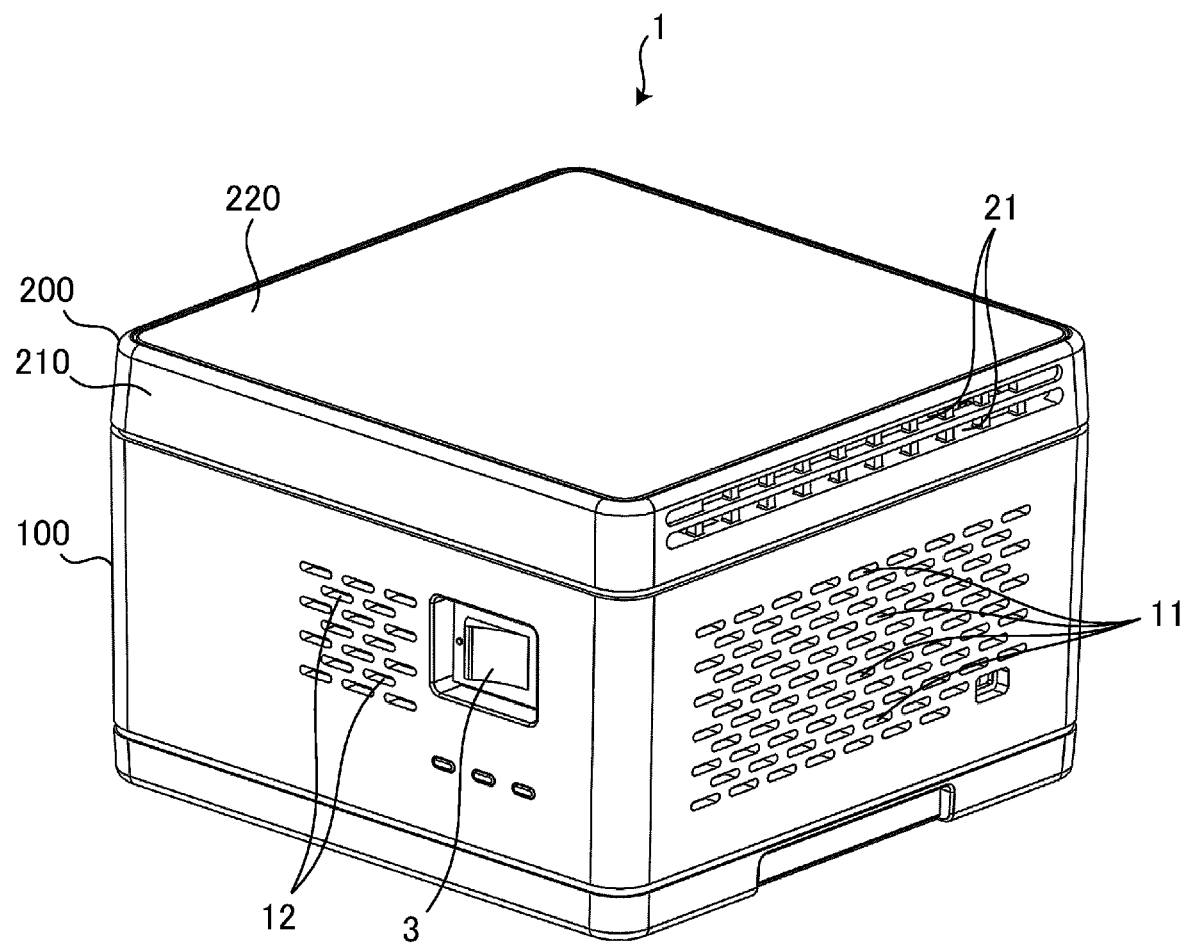
FIG. 1 is a perspective view showing an appearance of an electronic device according to an embodiment.

In general, according to one embodiment, provided are a structure capable of protecting an air intake portion from entry of water droplets or the like, and an electronic device including the structure.

The electronic device according to an embodiment includes: a housing which is a box-shaped container having an open upper surface, configured to house an electronic component and a fan for blowing air downward, and provided with an air exhaust hole; an inner lid to be attachable and detachable at a position at which an opening of the housing is closed, and provided with an air intake hole upstream of the fan in an air-blowing direction; and an upper lid provided to overlap the inner lid, and facing, from above, a surface provided with the air intake hole with a gap therebetween.

First Embodiment

An embodiment will be described with reference to the drawings. For convenience of description, a three-dimensional coordinate system is also shown in the drawings. In the drawings, a width direction of an electronic device 1 (a left-right direction) is defined as an X-axis direction, a depth direction of the electronic device 1 (a front-rear direction) is defined as a Y-axis direction, and a height direction of the electronic device 1 (an up-down direction) is defined as a Z-axis direction.

FIG. 1 is a perspective view showing an appearance of the electronic device 1 according to the embodiment. The electronic device 1 includes a housing 100 and a lid 200. The housing 100 is provided with a switch 3 for switching an energization state of the electronic device 1 between ON and OFF states.

Figure 2:
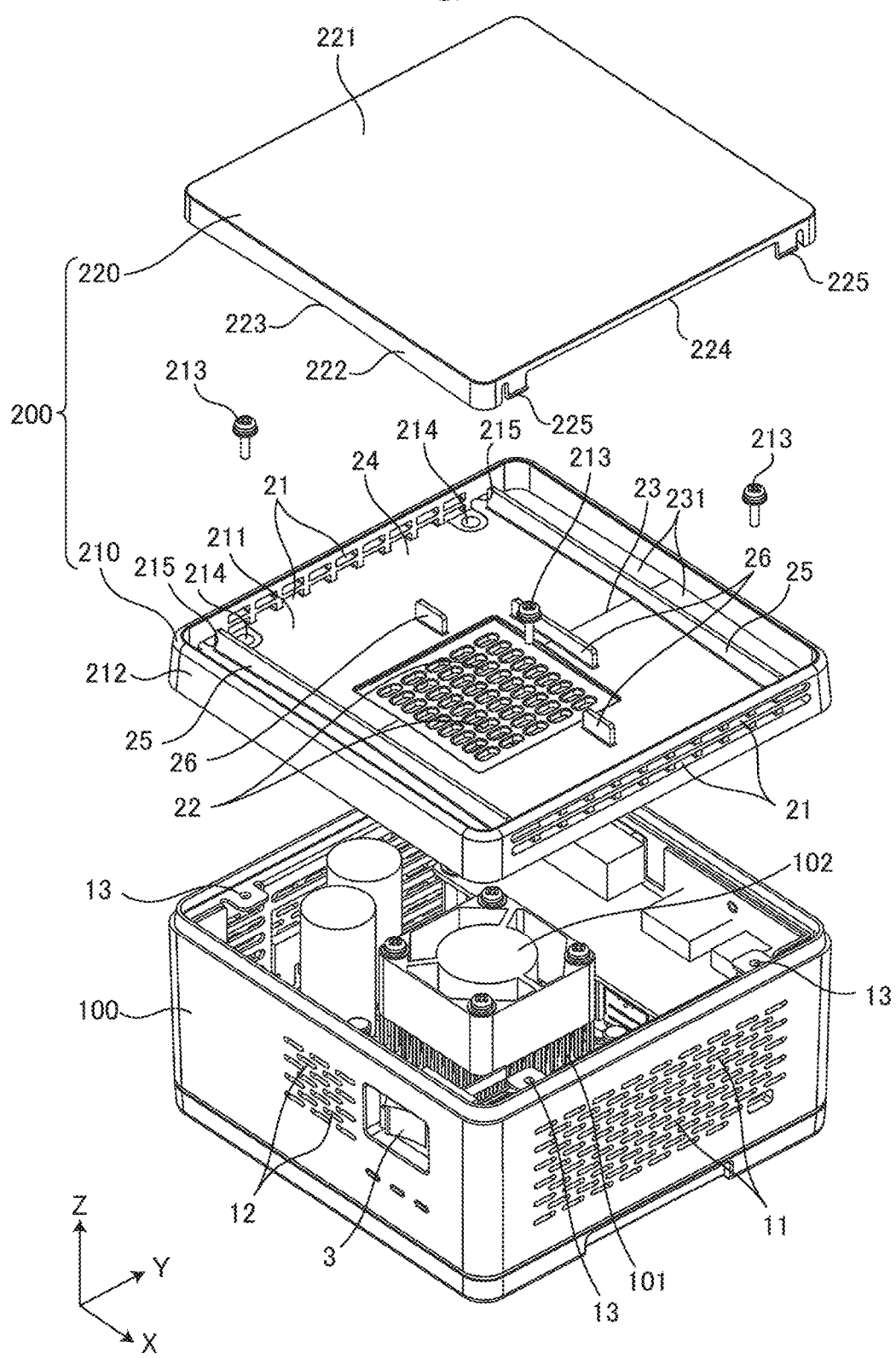
FIG. 2 is an exploded perspective view showing a configuration of the electronic device.

FIG. 2 is an exploded perspective view showing a configuration of the electronic device 1. The housing 100 is a box-shaped container having an open upper surface, and houses a heat sink 101 and a fan 102. The lid 200 closes an opening of the housing 100.

Figure 3:
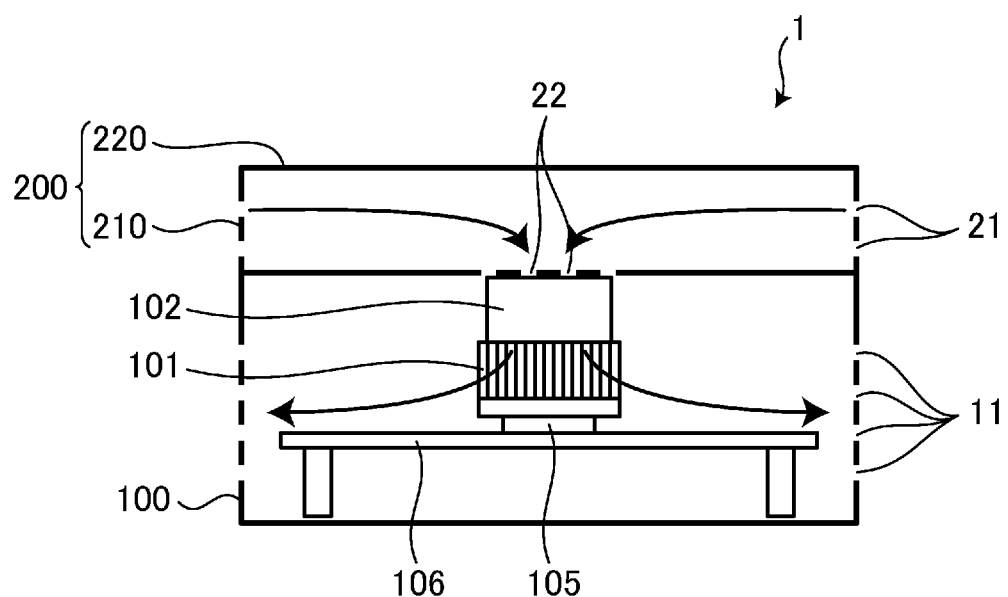
FIG. 3 is a longitudinal cross-sectional front view schematically showing an internal structure.

FIG. 3 is a longitudinal cross-sectional front view (a ZX cross-section) schematically showing an internal structure of the electronic device 1. The housing 100 houses a substrate 106 on which various electronic components such as a central processing unit (CPU) 105 are provided. The CPU 105, the heat sink 101, and the fan 102 are disposed to vertically overlap from bottom to top. The heat sink 101 is mounted on the CPU 105 to absorb and dissipate heat generated by the CPU 105. The fan 102 blows air downward toward the heat sink 101.

As shown in FIG. 2, air intake holes 21 and 22 through which the air taken in by the fan 102 passes are formed in the lid 200, and air exhaust holes 11 and 12 are formed in the housing 100. Each of the air intake holes 21 and 22 and the air exhaust holes 11 and 12 is not a single hole, but a collection of a plurality of holes collectively provided in a predetermined range.

The air intake holes 21 are through holes provided in an outer peripheral portion of the lid 200 and are also used as drain holes for discharging (draining) a liquid. The air intake holes 22 are provided in a range covering an upstream of the fan 102 in an air-blowing direction. If the fan 102 is operated, the air is taken in through the air intake holes 21. The air taken in is absorbed into the air intake holes 22 and discharged through the air exhaust holes 11 and 12 formed in the housing 100.

The lid 200 includes a base cover (an example of an inner lid) 210 and an external cover (an example of an upper lid) 220 that overlaps the base cover 210.

The base cover 210 has a tray shape, and is attachable and detachable at a position at which the opening of the housing 100 is closed. More specifically, the base cover 210 includes a bottom surface 211 and four side walls 212. The side walls 212 are erected on edges of the bottom surface 211, protrude upward, and surround the bottom surface 211.

The air intake holes 22 are provided in a central portion of the bottom surface 211. The bottom surface 211 has two inclined surfaces 231 that sandwich a top portion 23 therebetween and descend to both sides of the bottom surface 211. The inclined surfaces 231 are inclined flat surfaces. An inclination angle is, for example, about 2°. The top portion 23 is positioned in the range in which the air intake holes 22 are provided.

The air intake holes 21 are provided in, among the four side walls 212, the side walls 212 adjacent to valleys 24 downward from the inclined surfaces 231. The air intake holes 21 discharge a liquid (water or the like) flowing downward from the inclined surfaces 231.

The base cover 210 includes a pair of partition walls 25. The partition walls 25 are a pair of rib-shaped portions facing each other with the air intake holes 21 sandwiched therebetween. A longitudinal direction of the partition walls 25 is along an arrangement direction of the inclined surfaces 231. The partition walls 25 are positioned across the top portion 23.

The base cover 210 includes ribs 26. The ribs 26 are protruding portions disposed at a plurality of positions around the air intake holes 22, support a top surface 221 (to be described later) of the external cover 220, and prevent the top surface 221 from bending.

The external cover 220 is provided to overlap the base cover 210. The external cover 220 includes the top surface 221 and leg portions 222.

The top surface 221 covers the air intake holes 22 and is a surface facing the bottom surface 211 of the base cover 210 in which a gap is provided between the top surface 221 and the bottom surface 211. Here, a space sandwiched between the top surface 221 and the bottom surface 211 and surrounded by the side walls 212 is defined as an air intake chamber. The lid 200 includes the air intake chamber. The leg portions 222 are each a portion provided at edges of the top surface 221 and to be fitted to an inner side of the side walls 212 of the base cover 210.

The leg portion 222 has a plate shape and is interposed between the partition wall 25 and the side wall 212 facing the partition wall 25. Since the leg portion 222 is in contact with the inclined surfaces 231, portions 223 that come into contact with the top portion 23 are recessed in a concave shape.

The leg portions 222 are provided at positions where the air intake holes 21 provided in the side walls 212 of the base cover 210 are not closed. In other words, the leg portions 222 include cutout portions 224 in ranges facing the air intake holes 21.

The external cover 220 further includes two pairs of claw portions 225. Each pair of claw portions 225 are provided with the cutout portion 224 sandwiched therebetween, and have elasticity in a shape in which a tip end portion thereof is warped outward. If the tip end portions of the claw portions 225 are placed on the base cover 210, the tip end portions of the claw portions 225 are hooked by engagement holes 215 provided at four inner corners of the side walls 212. Accordingly, the base cover 210 and the external cover 220 are integrated to each other. If the external cover 220 is removed from the base cover 210, the hook is released by bending the claw portions 225 inward.

The base cover 210 is fixed to the housing 100 by screwing. The housing 100 has screw receiving holes 13 for receiving screws 213 at four corners. The base cover 210 has screw receiving holes 214 corresponding to the screw receiving holes 13. The screw receiving hole 214 is provided in a range sandwiched between the pair of partition walls 25.

In the electronic device 1 having such a configuration, if the energization state of the electronic device 1 is switched to the ON state by the switch 3 while the opening of the housing 100 is closed with the lid 200, the fan 102 rotates to blow air to the heat sink 101. Accordingly, the heat of the heat sink 101 conducted from the heat-generating CPU 105 is quickly dissipated into the air. The fan 102 blows the air in a negative direction of a Z axis, that is, in a direction from top to bottom in FIG. 3. The fan 102 sends the air absorbed through the air intake holes 22. The air to be taken into the air intake holes 22 is taken in through the air intake holes 21.

It is assumed that the electronic device 1 operating as described above is placed in an environment exposed to water droplets or oil droplets, such as a cooking place. In this case, the electronic device 1 may be covered with the water droplets or the oil droplets.

Figure 4:
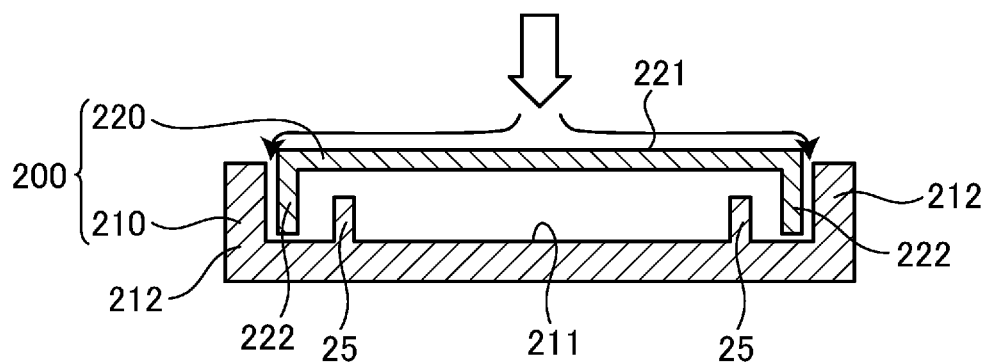
FIG. 4 is a longitudinal cross-sectional side view of a lid, showing an example of a flow of liquid if the lid is covered with a liquid such as water.

FIG. 4 is a longitudinal cross-sectional side view (an YZ cross-section) of the lid 200, showing an example of a flow of liquid if the lid 200 is covered with a liquid such as water. If the water droplets fall on the electronic device 1, the water flows, as indicated by arrows in FIG. 4, from edges of the top surface 221 of the external cover 220 into the inner side of the side walls 212 of the base cover 210. In this case, the inflowing water is blocked by the partition walls 25 and is not directed to the central portion of the bottom surface 211.

Figure 5:
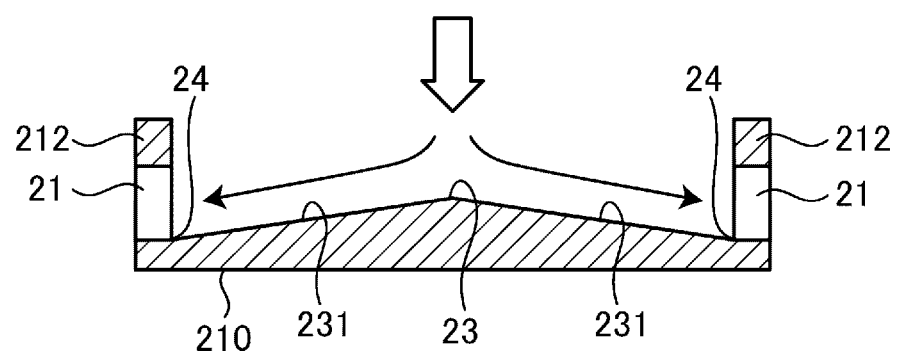
FIG. 5 is a longitudinal cross-sectional front view of a base cover, showing an example of a flow of liquid between partition walls and side walls.

Next, FIG. 5 is a longitudinal cross-sectional front view (the ZX cross-section) of the base cover 210, showing an example of a flow of liquid between the partition walls 25 and the side walls 212. As shown in FIG. 5, the bottom surface 211 is formed in a mountain shape in which two inclined surfaces 231 are combined and descend from the top portion 23 to the valleys 24. Accordingly, the water flowing into the space between the partition walls 25 and the side walls 212 flows down along the inclined surfaces 231, reaches the valleys 24, and is discharged to the outside through the air intake holes 21.

As described above, even if the liquid such as water droplets falls on the electronic device 1, the liquid does not enter under the base cover 210. Accordingly, various electronic components such as the CPU 105 incorporated in the housing 100, the substrate 106, the fan 102, and the heat sink 101 can be protected from getting wet.

The position of the screw receiving hole 214 is between the pair of partition walls 25, whereas it is more preferable that the screw receiving hole 214 is positioned on an inner side (closer to the central portion) than a flow path through which the liquid droplets received by the top surface 221 and entering the inner side of the side walls 212 of the base cover 210 are discharged through the air intake holes 21.

The electronic device 1 is, for example, a server that receives an image captured by a camera installed in a store and processes the image. Such an electronic device 1 tends to be small in size, and is often installed in a place or an environment that is not suitable as a place to put the electronic device 1 (specifically, a narrow backyard, a cooking place that may get wet, or the like).

In the electronic device 1 according to the present application, first, in order to reduce the size, a heat source (the CPU 105), the heat sink 101, and the fan 102 are disposed substantially without a gap therebetween. In order to reduce the size, a degree of freedom of arrangement decreases, and an arrangement pattern that can be implemented is limited.

Here, in general, the fan is often mounted in a direction of taking in the air from a side surface of a housing that houses the heat source. In contrast, the fan 102 according to the embodiment is mounted in a direction of taking in the air from above and sending out the air downward in order to implement the above-described arrangement without the gap. Further, in order to implement air intake and exhaust using the fan 102 disposed as described above without any problem, the air intake holes 22 penetrating the up-down (the Z axis) direction are provided. This is because if the fan 102 is mounted in a direction of blowing the air from top to bottom, the air intake holes 22 capable of supplying air from above the fan 102 are necessary.

If there are the air intake holes 22 penetrating the up-down direction as described above, if the electronic device 1 gets wet or the like, it is necessary to have a structure in which entry of a liquid such as water through the air intake holes 22 is blocked and various electronic components inside the housing 100 do not get wet.

Therefore, in the electronic device 1 according to the embodiment, the external cover 220 facing the air intake holes 22 with a gap therebetween is provided, so that the water droplets do not directly enter the air intake holes 22. In addition, the air is taken in the air intake holes 22 through the air intake chamber (the space sandwiched between the top surface 221 and the bottom surface 211 and surrounded by the side walls 212), and the air is supplied to the air intake chamber by the air intake holes 21 which are not upward, so that the air intake holes 21 secure an air intake route and a draining route.

Further, in the electronic device 1 according to the embodiment, the air intake holes 22 are positioned at the top portion 23 of the inclined surfaces 231 such that the water droplets do not enter the inside of the housing 100 along the surface in which the air intake holes 22 are provided, and the rib-shaped partition walls 25 are provided on sides not handled by inclination of the inclined surfaces 231 to prevent the inflow of the water droplets. Then, the external cover 220 is made one size smaller than the base cover 210 and a shape and an insertion position of the leg portion 222 of the external cover 220 are set such that the liquid droplets transmitted downward from the edges of the external cover 220 are received outside the partition walls 25 or downward from the inclined surfaces 231. Since a structure in which the external cover 220 is fitted into the base cover 210 is obtained, a screw or the like is not required to fix the external cover 220.

In the above embodiment, the inclined surface 231 is shown as an inclined flat surface. In practice, even if the inclined surface 231 is a curved surface, it does not matter as long as there is a height difference from the top portion 23 to the valley 24.

While certain embodiments have been described, these embodiments have been presented by way of examples only, and are not intended to limit the scope of the exemplary embodiment. These novel embodiments may be implemented in a variety of other forms; various omissions, substitutions, and changes may be made without departing from the spirit of the exemplary embodiment. These embodiments and the modifications thereof are included in the scope and the spirit of the exemplary embodiment and are also included in the exemplary embodiment described in the claims and an equivalent scope thereof.

What is claimed is:

1. An electronic device, comprising:
a housing comprising a box-shaped container having an open upper surface and an air exhaust hole, the housing configured to house an electronic component and a fan for blowing air downward;
an inner lid attachable and detachable from the housing at a position at which the open upper surface is at least partially closed, with the inner lid comprising an air intake hole upstream of the fan in an air-blowing direction; and
an upper lid provided to overlap the inner lid, and facing, from above, a surface provided with the air intake hole with a gap therebetween,
wherein the inner lid includes two inclined surfaces having a top portion positioned in a range in which the air intake hole is provided and which descend to both sides with the top portion sandwiched therebetween, and a pair of partition walls having rib-shaped portions facing each other with the air intake hole sandwiched therebetween and whose longitudinal direction is along an arrangement direction of the two inclined surfaces.

2. The electronic device according to claim 1, wherein
the inner lid has the surface provided with the air intake hole as a bottom surface, and has a side wall erected on an edge of the bottom surface, and
the upper lid has a top surface facing, from above, the bottom surface with the gap therebetween, and a leg portion which is provided on an edge of the top surface and to be fitted to an inner side of the side wall.

3. The electronic device according to claim 2, wherein
a through hole is provided in a portion of the side wall of the inner lid adjacent to a valley downward from an inclined surface, of the two inclined surfaces, to take in air, from the fan blowing in air downward, absorbed into the air intake hole and to discharge a liquid flowing downward from the inclined surface.

4. The electronic device according to claim 3, wherein
the leg portion is provided at a position at which the through hole is not closed.

5. The electronic device according to claim 1, further comprising a switch for switching an energization state of the electronic device between ON and OFF states.

6. The electronic device according to claim 1, wherein
the air intake hole faces downward.

7. A computer, comprising:
a housing comprising a box-shaped container having an open upper surface and an air exhaust hole, the housing configured to house a central processing unit and a fan for blowing air downward;
an inner lid attachable and detachable from the housing at a position at which the open upper surface is at least partially closed, with the inner lid comprising an air intake hole upstream of the fan in an air-blowing direction; and
an upper lid provided to overlap the inner lid, and facing, from above, a surface provided with the air intake hole with a gap therebetween,
wherein the inner lid includes two inclined surfaces having a top portion positioned in a range in which the air intake hole is provided and which descend to both sides with the top portion sandwiched therebetween, and a pair of partition walls having rib-shaped portions facing each other with the air intake hole sandwiched therebetween and whose longitudinal direction is along an arrangement direction of the two inclined surfaces.

8. The computer according to claim 7, wherein
the inner lid has the surface provided with the air intake hole as a bottom surface, and has a side wall erected on an edge of the bottom surface, and
the upper lid has a top surface facing, from above, the bottom surface with the gap therebetween, and a leg portion which is provided on an edge of the top surface and to be fitted to an inner side of the side wall.

9. The computer according to claim 8, wherein
a through hole is provided in a portion of the side wall of the inner lid adjacent to a valley downward from an inclined surface, of the two inclined surfaces, to take in air, from the fan blowing in air downward, absorbed into the air intake hole and to discharge a liquid flowing downward from the inclined surface.

10. The computer according to claim 9, wherein the leg portion is provided at a position at which the through hole is not closed.

11. The computer according to claim 7, further comprising a switch for switching an energization state of the computer between ON and OFF states.

12. The computer according to claim 7, wherein the air intake hole faces downward.

13. A method of reducing water damage to an electronic device, comprising:
   equipping the electronic device with:
      a housing comprising a box-shaped container having an open upper surface and an air exhaust hole, the housing configured to house an electronic component and a fan for blowing air downward,
      an inner lid attachable and detachable from the housing at a position at which the open upper surface is at least partially closed, with the inner lid comprising an air intake hole upstream of the fan in an air-blowing direction, and
      an upper lid provided to overlap the inner lid, and facing, from above, a surface provided with the air intake hole with a gap therebetween,
   to reduce or prevent water contact with the electronic component in the housing,
   wherein the inner lid includes two inclined surfaces having a top portion positioned in a range in which the air intake hole is provided and which descend to both sides with the top portion sandwiched therebetween, and a pair of partition walls having rib-shaped portions facing each other with the air intake hole sandwiched therebetween and whose longitudinal direction is along an arrangement direction of the two inclined surfaces.

14. The method according to claim 13, further comprising preventing water from entering the air intake hole via a bottom surface of the inner lid,
   wherein the bottom surface is comprised by the surface provided with the air intake hole, and
   wherein the inner lid has a side wall erected on an edge of the bottom surface, and
   the upper lid has a top surface facing, from above, the bottom surface with the gap therebetween, and a leg portion which is provided on an edge of the top surface and to be fitted to an inner side of the side wall.

15. The method according to claim 14, further comprising absorbing air, from the fan blowing in air downward, from the air intake hole into a through hole is provided in a portion of the side wall of the inner lid adjacent to a valley downward from an inclined surface, of the two inclined surfaces, and discharging a liquid flowing downward from the inclined surface.

16. The method according to claim 13, further comprising switching an energization state of the electronic device between ON and OFF states.

17. The method according to claim 13, further comprising preventing water from entering the air intake hole.

* * * * *